(12) United States Patent
Ko et al.

(10) Patent No.: US 6,806,155 B1
(45) Date of Patent: Oct. 19, 2004

(54) METHOD AND SYSTEM FOR SCALING NONVOLATILE MEMORY CELLS

(75) Inventors: Kelwin Ko, San Jose, CA (US); Chi Chang, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 51 days.

(21) Appl. No.: 10/150,255

(22) Filed: May 15, 2002

(51) Int. Cl.[7] .......................................... H01L 21/8238
(52) U.S. Cl. ...................... 438/303; 438/305; 438/306; 438/307; 257/316; 257/408
(58) Field of Search ................. 438/303–307, 438/217, 228, 230, 290, 291

(56) References Cited

U.S. PATENT DOCUMENTS 5,395,773 A * 3/1995 Ravindhran et al. ........ 438/217
6,448,141 B1 * 9/2002 Ahmad et al. .............. 438/303
2002/0153559 A1 * 10/2002 Yeap et al. .................. 257/335

* cited by examiner

Primary Examiner—Dung A. Le
(74) Attorney, Agent, or Firm—Winstead Sechrest & Minick P.C.

(57) ABSTRACT

A method and system for providing a semiconductor device are described. The method and system include providing a plurality of gate stacks and a first source drain halo implant. The first source and drain halo implant uses the plurality of gate stacks as a mask. The method and system also include providing a lightly doped source and drain implant and a N+ source and drain implant. The source connection implant is for connecting a portion of the plurality of sources. The second source and drain implant uses the plurality of gate stacks as a mask. Moreover, CoSi formed on the source region provides a lower resistence for lines connecting the sources, allowing a lower dose to be used for the N+ source and drain implant.

10 Claims, 6 Drawing Sheets

METHOD AND SYSTEM FOR SCALING NONVOLATILE MEMORY CELLS

FIELD OF THE INVENTION

The present invention relates to semiconductor devices, and more particularly to a method and system for providing a nonvolatile memory cell that is scalable.

BACKGROUND OF THE INVENTION

Nonvolatile memory devices are used for a variety of applications. Such conventional semiconductor devices typically include gate stacks which are part of devices, such as memory cells. Generally, a source is positioned at one edge of the gate stack, while the drain is at the opposing end of the gate stack. Field insulating regions generally run perpendicular to the gate stacks and are typically used to electrically isolate different devices. The field insulating regions are typically composed of oxide. In addition, electrical connection is made to the sources.

In order to fabricate a conventional nonvolatile memory device, gate stacks are formed and oxidized. A mask which exposes only the regions in which the sources will be formed is provided. A conventional source side implant of boron (B+) is provided. The mask is removed and mask which only exposes the drain side is provided. A conventional drain side implant, typically of arsenic, is then provided and annealed. A self-aligned source etch mask and etch is then provided. The self-aligned source edge masks the drain side. However, the mask does not extend to the edges of the gate stack at the source side. Thus, the self-aligned source etch is aligned using the gate stacks. The self-aligned source etch removes a portion of the field insulating regions between the sources as well as the oxide layer above the sources. A conventional implant which connects the sources is then provided. The conventional implant is typically a high dose As implant, on the order of $3 \times 10^{15}$ ions/cm$^2$. Spacers are then formed at the edges of the gate stack, and CoSi formed on the drain and tops of the gate stack. Thus, contact can also be made to the drains and gate stacks.

Although the conventional nonvolatile memory cell functions, one of ordinary skill in the art will readily realize that that fabrication of the conventional nonvolatile memory cell requires a number of masks for which alignment is critical. In particular, the masks for the boron implant, the drain side implant and the source connection implant must be properly aligned to ensure that the correct portion of the conventional semiconductor device is implanted. This alignment becomes increasingly difficult as the size of the memory cell decreases. As a result, fabrication of a smaller memory cell would be more difficult.

Accordingly, what is needed is a system and method for providing a semiconductor device that can more readily be scaled down in size. The present invention addresses such a need.

SUMMARY OF THE INVENTION

The present invention provides a method and system for providing a semiconductor device. The method and system comprise providing a plurality of gate stacks and a first source and drain halo implant. The first source and drain halo implant uses the plurality of gate stacks as a mask. The method and system also comprise providing a lightly doped source and drain implant and a N+ source and drain implant. The source connection implant is for connecting a portion of the plurality of sources. The second source and drain implant uses the plurality of gate stacks as a mask.

According to the system and method disclosed herein, the present invention source and drain implants, each of which uses the gate stacks as a mask are used, thereby reducing the number of alignment-critical masks used during fabrication.

DETAILED DESCRIPTION OF THE INVENTION

The present invention relates to an improvement in semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a semiconductor device. The method and system comprise providing a plurality of gate stacks and a first source and drain halo implant. The first source and drain halo implant uses the plurality of gate stacks as a mask. The method and system also comprise providing a lightly doped source and drain implant and a N+ source and drain implant. The source connection implant is for connecting a portion of the plurality of sources. The second source and drain implant uses the plurality of gate stacks as a mask.

The present invention will be described in terms of methods including particular steps. Furthermore, for clarity, some steps are omitted. One of ordinary skill in the art will, therefore, readily recognize that this method and system will operate effectively for other methods having different and/or additional steps. The present invention is also described in conjunction with a particular nonvolatile memory device having certain components. However, one of ordinary skill in the art will readily recognize that the present invention is consistent with a semiconductor device having other and/or different components.

Figure 1:
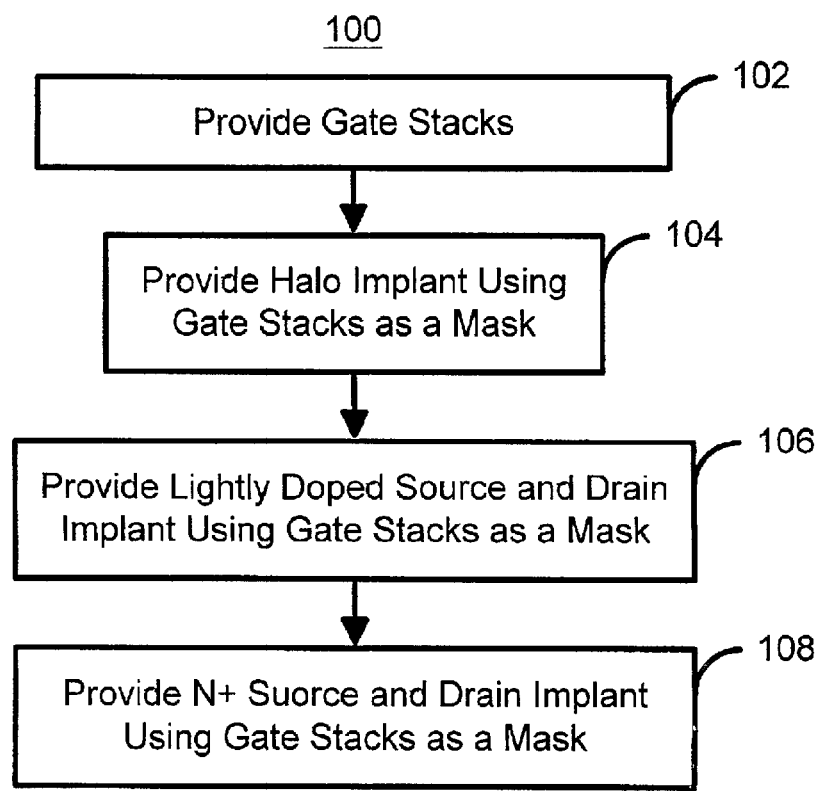
FIG. 1 is a high-level flow chart of one embodiment of a method in accordance with the present invention for providing a scalable semiconductor device.

To more particularly illustrate the method and system in accordance with the present invention, refer now to FIG. 1, depicting a high-level flow chart of one embodiment of a method 100 in accordance with the present invention for providing a scalable semiconductor device. The semiconductor device formed is preferably a nonvolatile memory device. A plurality of gate stacks is provided, via step 102. The gate stacks preferably include at least a floating gate and a control gate separated by an insulating layer. The gate stacks generally are separated from the substrate by a very thin tunneling insulating layer. Step 102 thus includes depositing the layers which form the gates of the gate stack as well as masking and etching the layers to form the gate stacks. A halo implant is provided using the gate stacks as a mask. The halo implant is preferably composed of boron (B+) and preferably has a dose on the order of $1 \times 10^{14}$ ions/cm². In one embodiment, the dose is between $0.8 \times 10^{14}$ and $1.5 \times 10^{14}$ ions/cm². However, a higher or lower dose implant may be used. An additional lightly doped source and drain implant that uses the gate stacks for a mask is provided, via step 106. The source and drain implant provided in step 106 is preferably a LDD implant. In addition, a third, N+ implant is provided for the source and drain, via step 108. The N+ implant also uses the gate stacks as a mask.

Thus, the source and drain implants are performed in steps 104, 106 and 108 using the gate stacks as a mask. Consequently, masks for which alignment is critical need not be used in implanting the source and drain. As a result, the method 100 can more readily be used for semiconductor devices of other sizes. Furthermore, due to the use of CoSi on the source region, the relatively high implant used in connecting the sources of the semiconductor device can be eliminated. Instead, lower dose LDD and N+ implants can be used to connect the sources. The method 100 can thus be used to provide more scalable semiconductor devices.

Figure 2:
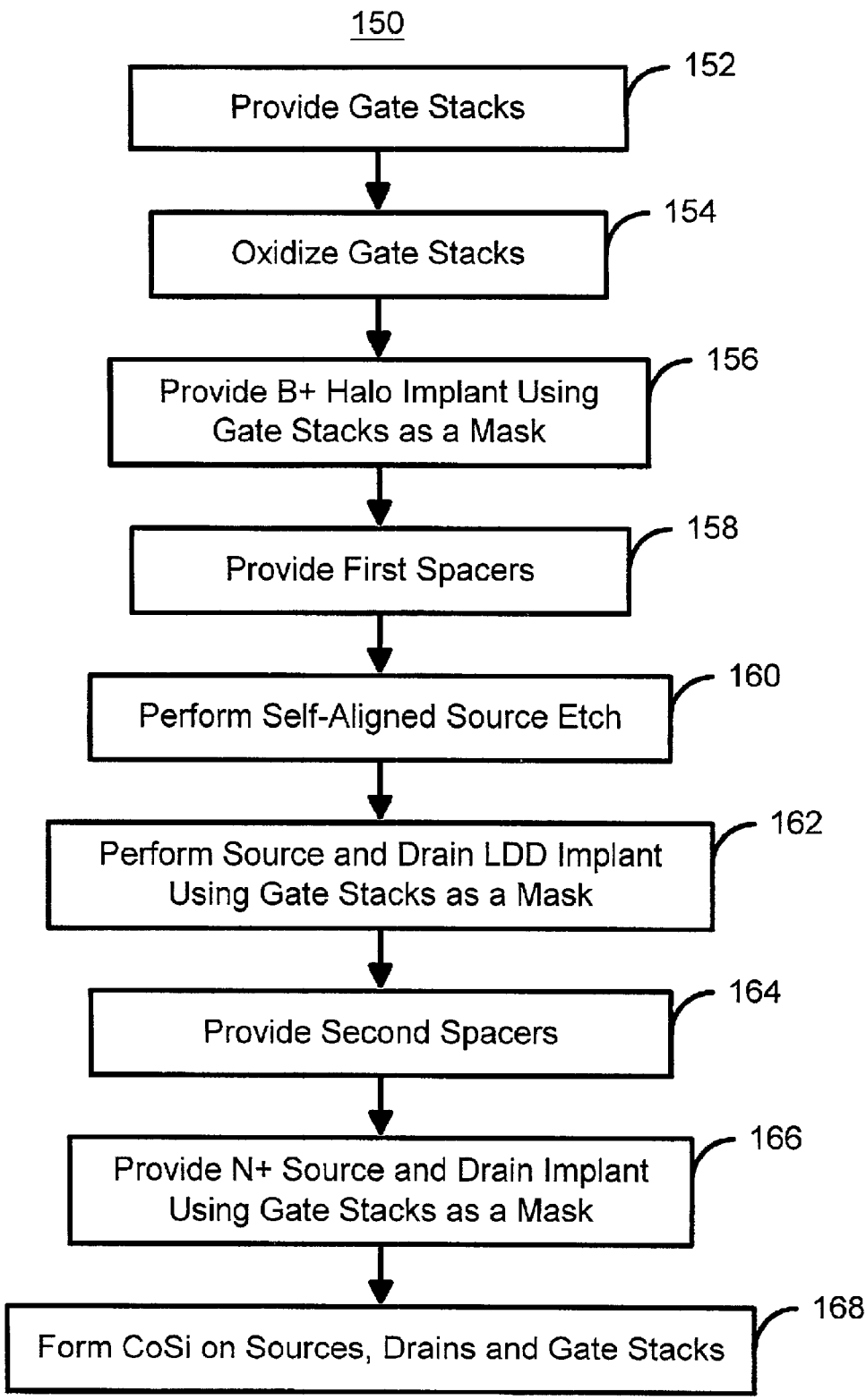
FIG. 2 is a more detailed flow chart of one embodiment of a method in accordance with the present invention for providing a scalable semiconductor device.

FIG. 2 is a more detailed flow chart of a preferred embodiment of a method 150 in accordance with the present invention for providing a scalable semiconductor device. FIGS. 3A–3G depict one embodiment of a scalable semiconductor device 200 in accordance with the present invention during fabrication. The method 150 will be described in conjunction with the semiconductor device 200.

Gate stacks for the semiconductor device are formed, via step 152. In a preferred embodiment, the gate stacks are formed on a thin tunneling oxide layer. Also in a preferred embodiment the gate stacks are formed in step 152 by depositing the layers in the gate stacks, including the polysilicon layers for floating and control gates, and then etching portions of the layers to form the gate stacks. An oxide layer is formed on the gate stacks, via step 154.

Figure 3A:
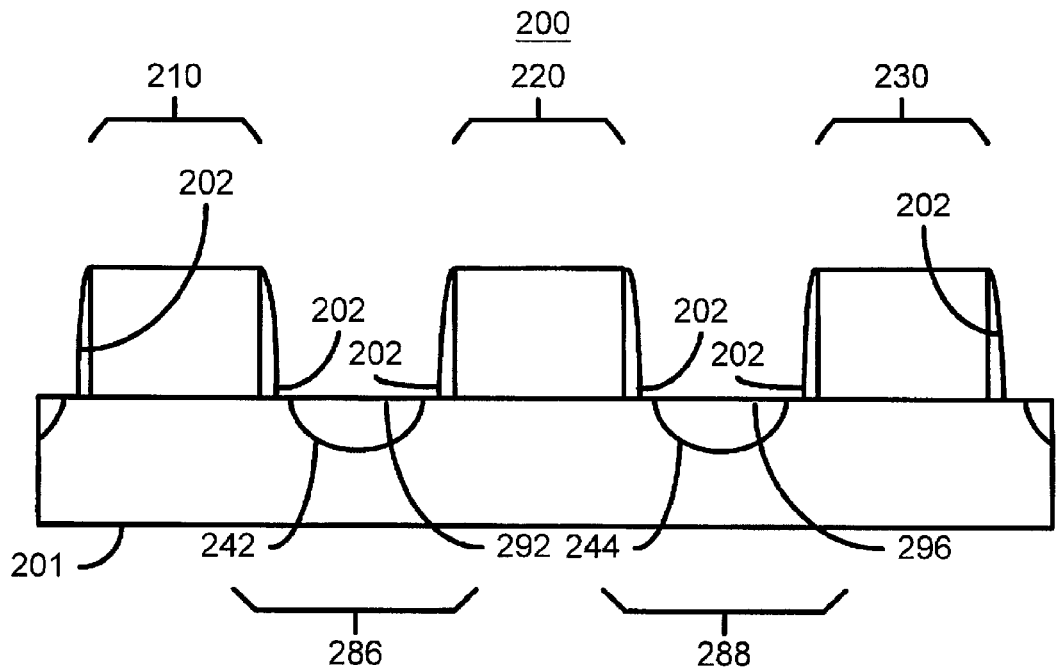
FIGS. 3A–3G depict one embodiment of a scalable semiconductor device in accordance with the present invention during fabrication.

A halo implant that uses the gate stacks is provided, via step 156. The dopant used is preferably B+ and preferably has a dose on the order of $1 \times 10^{14}$ ions/cm². In one embodiment, the dose is between $0.5 \times 10^{14}$ and $1.5 \times 10^{14}$ ions/cm². However, a higher or lower dose implant may be used. FIG. 3A depicts the semiconductor device 200 during the halo implant. The semiconductor device 200 uses a substrate 201 and includes gate stacks 210, 220 and 230 and oxide layer 202. Each gate stack 210, 220 and 230 preferably includes at least a floating gate (not explicitly shown) and a control gate (not explicitly shown) separated by an insulating layer (not explicitly shown). The gate stacks 210, 220 and 230 are also separated from the substrate 201 by a thin insulating layer (not explicitly shown). The B+ halo implant forms doped halo regions 242 and 244. The doped halo region 242 will become part of a source, while the doped halo region 244 will become part of the drain.

Figure 3B:
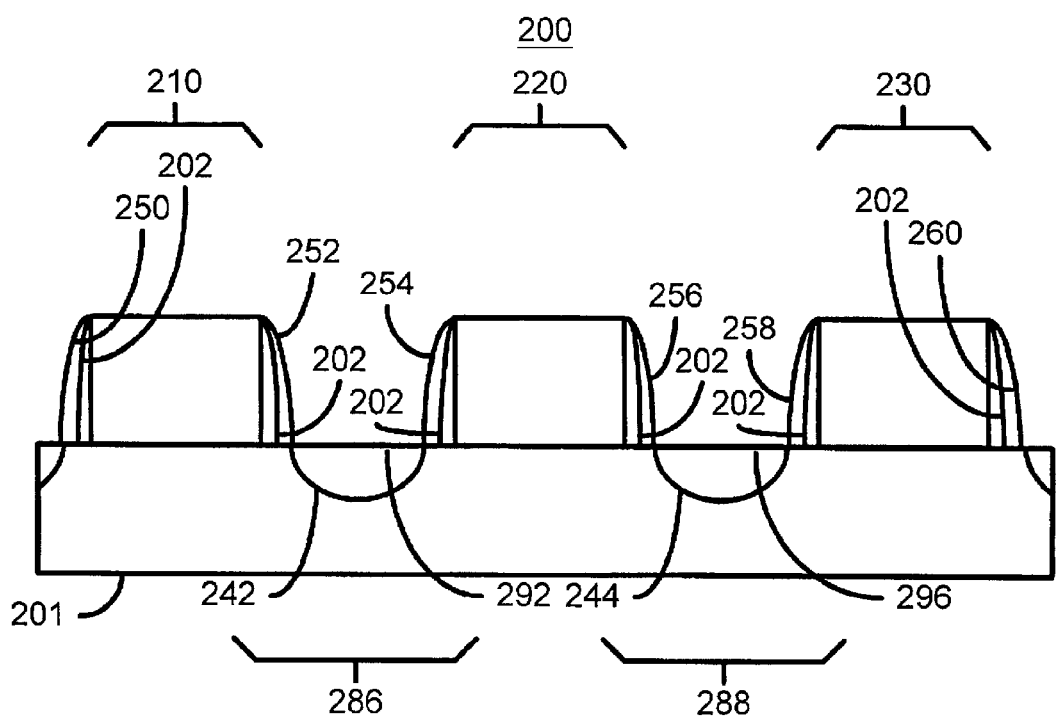

Spacers are provided at the edges of the gate stack, via step 158. Step 158 includes depositing a spacer layer, which is preferably a nitride layer, and etching the spacer layer to form the spacers. FIG. 3B depicts the semiconductor device 200 after the spacers 250, 252, 254, 256, 258 and 260 have been provided. The spacers 250, 252, 254, 256, 258 and 260 are preferably composed of nitride.

A self-aligned source ("SAS") etch is provided, via step 160. Step 160 preferably includes providing a SAS mask and etching the semiconductor device 200 with the mask in place. Step 160 also preferably includes removing the SAS mask after the semiconductor device 200 has been etched.

Figure 3C:
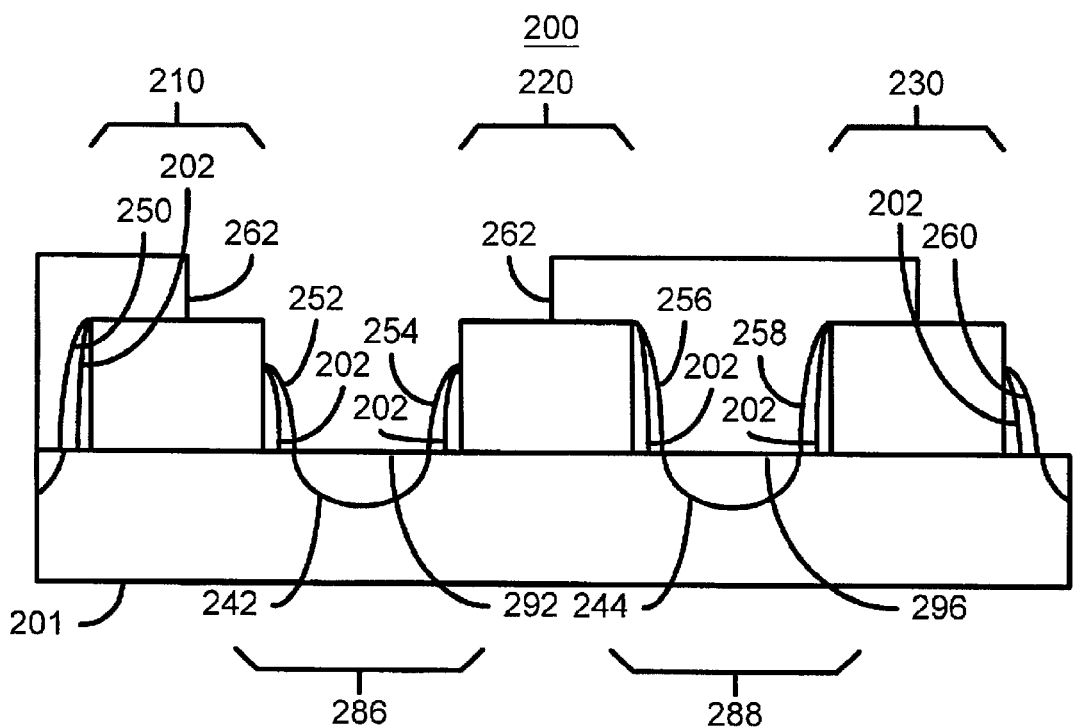

FIG. 3C depicts the semiconductor device 200 after the SAS etch. The SAS mask 262 is still present. Portions of the spacers 252 and 254 have been removed by the SAS etch. In addition, a portion of the field insulating regions (not shown) between memory cells along a particular gate stack has been removed. Consequently, the source region between the gate stacks 210 and 220 is exposed along the length of the gate stacks 210 and 220 (perpendicular to the page of FIG. 3C). The SAS etch performed in step 160 is preferably performed after the spacers have been provided in step 158. As a result, the spacers 252 and 254 can protect the sides of the gate stacks 210 and 220 from damage during the SAS etch.

Figure 3D:
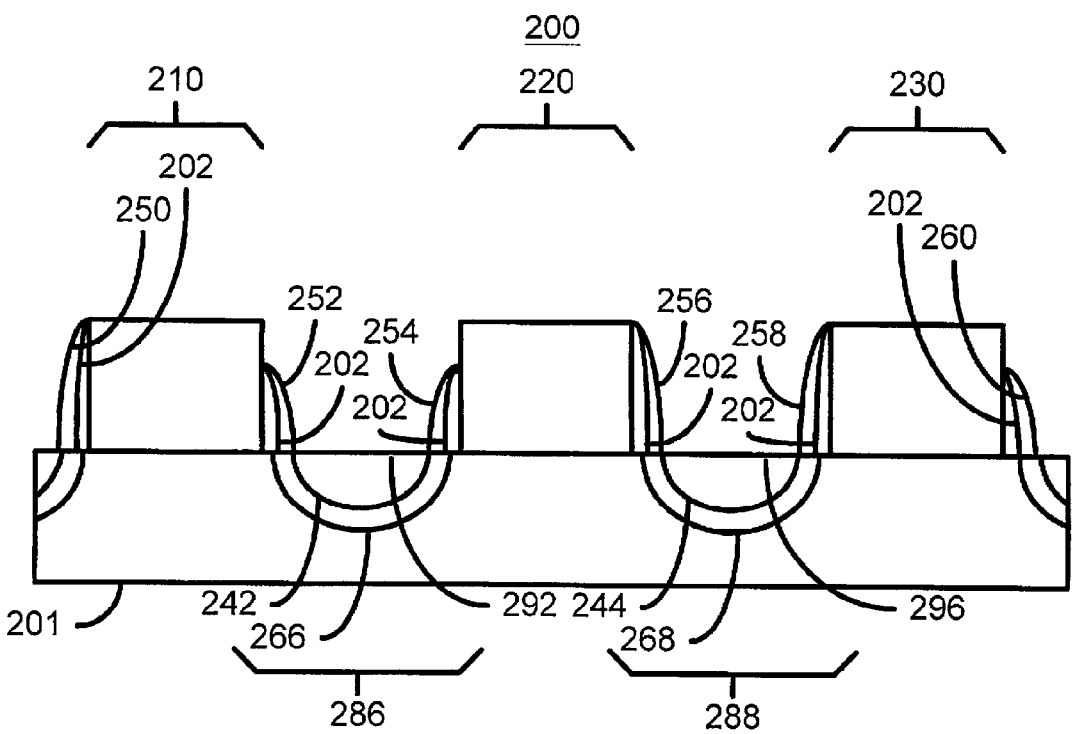

A source and drain implant, preferably an LDD implant, is provided, via step 162. The LDD implant uses the gate stacks 210, 220 and 230 as a mask. In a preferred embodiment, the LDD implant is an As implant. FIG. 3D depicts the semiconductor device 200 during the source and drain implant provided in step 162. The source and drain implant provides regions 266 and 268 in the semiconductor device 200.

Figure 3E:
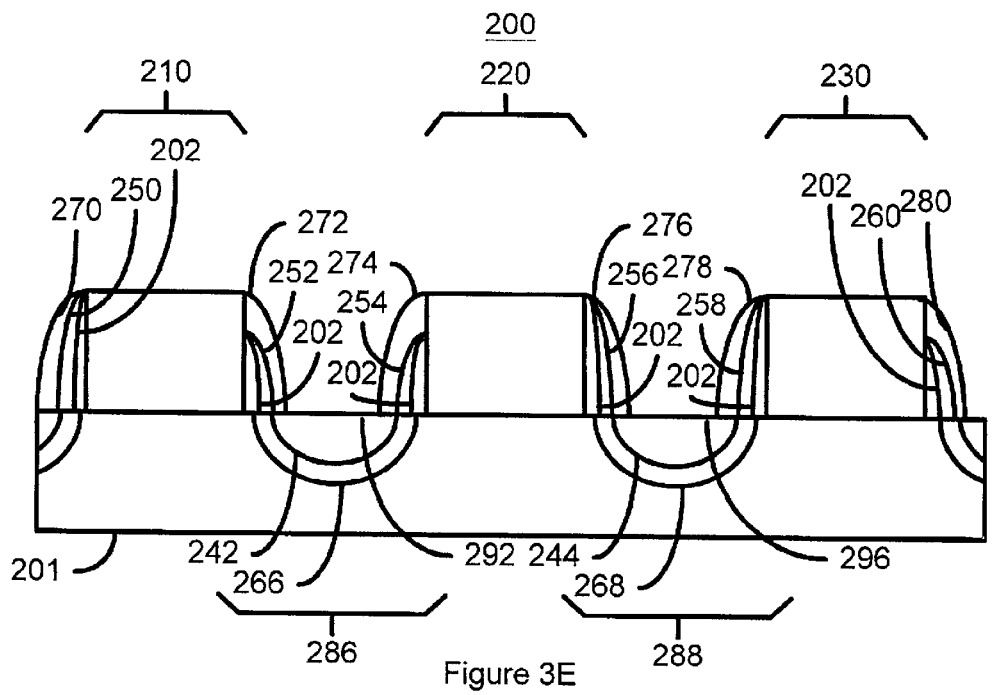

A second set of spacers is provided, via step 164. The second set of spacers is provided on the first set of spacers 250, 252, 254, 256 and 258. Step 164 includes depositing a spacer layer, which is preferably a nitride layer, and etching the spacer layer to form the spacers. FIG. 3E depicts the semiconductor device 200 after the second set of spacers 270, 272, 274, 276, 278 and 280 have been provided. The spacers 270, 272, 274, 276, 278 and 280 are preferably composed of nitride.

Figure 3F:
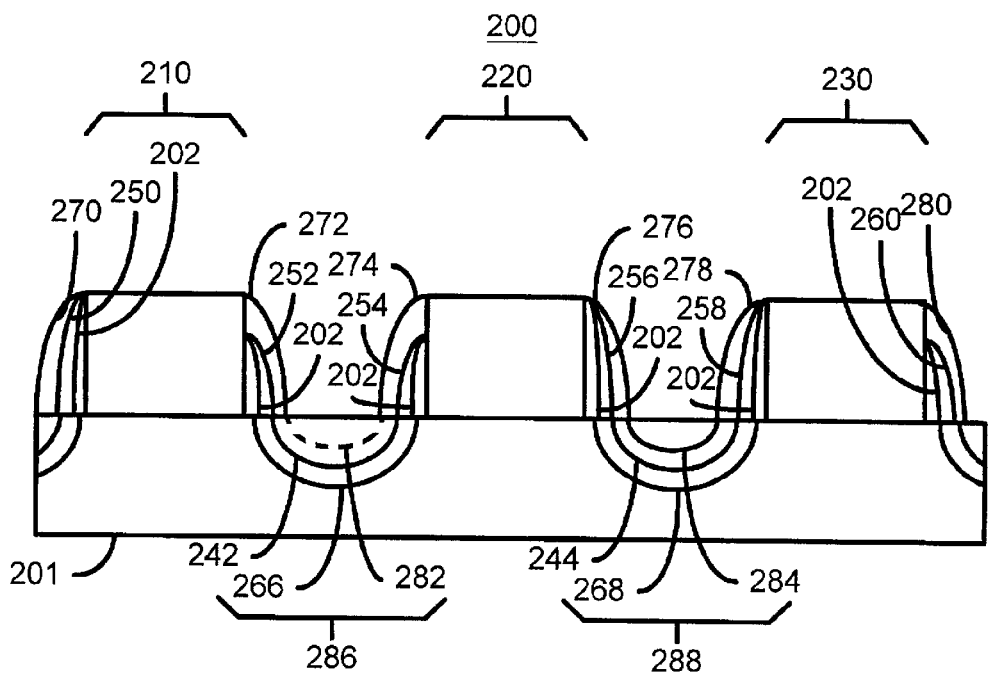

A N+ source and drain implant that uses the gate stacks 210, 220 and 230 as a mask is provided, via step 166. The N+ implant is preferably an As implant. The dopant preferably has a dose on the order of $0.8 \times 10^{15}$ ions/cm². In one embodiment, the dose is between $0.5 \times 10^{15}$ and $1.5 \times 10$ 15 ions/cm². However, a higher or lower dose implant may be used. FIG. 3F depicts the semiconductor device 200 during the N+ implant. The dopant forms regions 282 and 284. Thus, the source 286 and drain 288 are formed. The source 286 includes regions 242, 266 and 282 from the halo implant, the LDD implant and the final N+ implant, respectively.

Figure 3G:
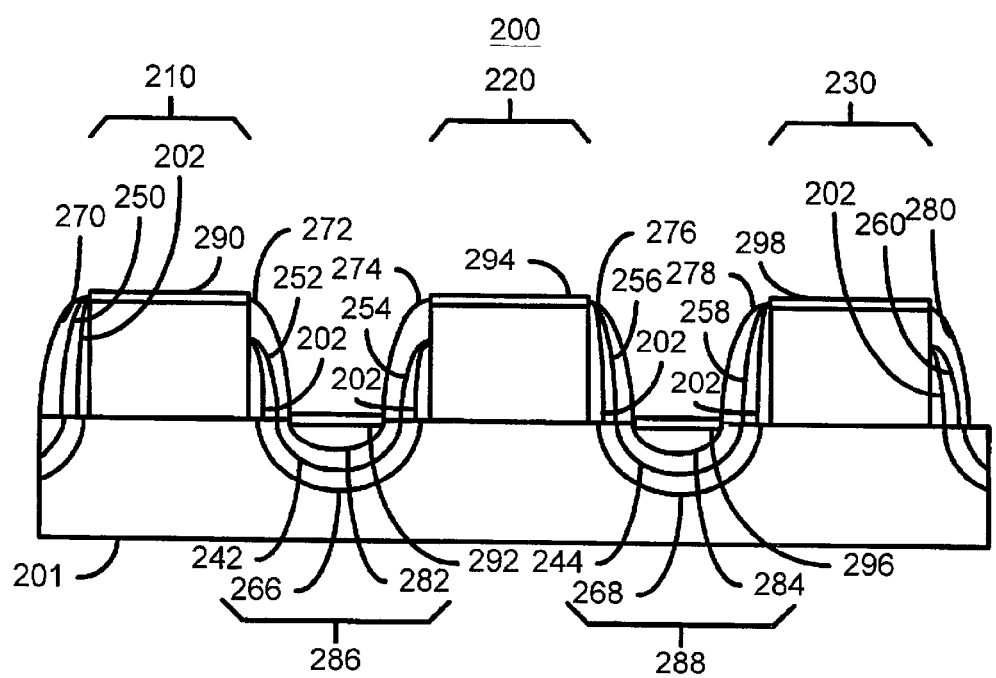

CoSi regions are formed on the gate stacks 210, 220 and 230 and on the source 286 and drain 288, via step 168. FIG. 3G depicts the semiconductor device 200 after the formation of CoSi regions 290, 292, 294, 296 and 298. Because of the formation of the CoSi on the gate stacks 210, 220 and 230, the source 286 and the drain 288, have a lower resistance with contacts (not shown) electrically connected to the gate stacks 210, 220 and 230, the source 286 and the drain 288, respectively.

Thus, the methods 100 and 150 provide a semiconductor device 200 which is more scalable. Instead of opening only the source side or drain side of the gate stacks for several implants, the methods 100 and 150 utilize the gate stacks for a mask and implant both the source and the drain in the halo implant, a first implant and a second, N+ implant. Thus, several masks for which alignment is critical have been eliminated, facilitating the fabrication of smaller devices. In addition, the CoSi formed on the source regions provides a lower resistance for the lines connecting the sources. A lower dose implant can be used for the N+ source and drain implant because this implant is not used to provide a low resistance between the sources. Because a lower dose is used, the sources can extend less far under the gate stacks, allowing the semiconductor device 200 to be scaled down.

A method and system has been disclosed for providing a nonvolatile memory device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a semiconductor device including a substrate, the method comprising the steps of:
   (a) providing a plurality of gate stacks;
   (b) providing a source and drain halo implant using the plurality of gate stacks as a mask;
   (c) providing a lightly doped source and drain implant using the plurality of gate stacks as a mask after the step of providing the source and drain halo implant;
   (d) providing a N+ source and drain implant using the plurality of gate stacks as a mask; and
   (e) performing a self-aligned source etch before the lightly doped source and drain implant is provided in step (c).

2. The method of claim 1 wherein the first source and drain halo implant is a boron implant.

3. The method of claim 2 wherein the boron implant is approximately $1 \times 10^{14}$ ions/cm$^2$.

4. The method of claim 1 wherein each of the plurality of gate stacks has a first edge and a second edge, the method further comprising the step of:
   (f) providing a spacer along each of the first edge and the second edge of each of the plurality of gate stacks prior to the step (e) of performing the self-aligned source etch.

5. The method of claim 4 further comprising the step of:
   (g) providing a second spacer along the spacer along each of the first edge and the second edge of each of the plurality of gate stacks before the step (d) of providing the N+ source and drain implant is performed.

6. The method of claim 1 wherein the N+ source and drain implant is an arsenic implant.

7. A method for providing a semiconductor device comprising the steps of:
   providing a plurality of gate stacks;
   providing a source and drain halo implant using said plurality of gate stacks as a mask;
   providing a first plurality of spacers at the edges of each of said plurality of gate stacks; and
   providing a lightly doped source and drain implant using said plurality of gate stacks as a mask after providing said first plurality of spacers at the edges of each of said plurality of gate stacks.

8. The method as recited in claim 7 further comprising the steps of:
   providing a second plurality of spacers at the edges of each of said plurality of gate stacks; and
   providing a N+ source and a drain implant using said plurality of gate stacks as a mask after providing said second plurality of spacers at the edges of each of said plurality of gate stacks.

9. The method as recited in claim 8 further comprising the step of:
   providing a self-aligned source etch after providing said first plurality spacers at the edges of said plurality of gate stacks.

10. The method as recited in claim 9 further comprising the step of:
    forming CoSi regions on said plurality of gate stacks.

* * * * *

UNITED STATES PATENT AND TRADEMARK OFFICE
CERTIFICATE OF CORRECTION

PATENT NO. : 6,806,155 B1
DATED : October 19, 2004
INVENTOR(S) : Kelwin Ko and Chi Chang It is certified that error appears in the above-identified patent and that said Letters Patent is hereby corrected as shown below:

Title page,
Item [57], ABSTRACT,
Line 3, following "source" please insert -- and --.

Column 6,
Line 27, following "edges" please insert -- of each --.

Signed and Sealed this

First Day of February, 2005

JON W. DUDAS
*Director of the United States Patent and Trademark Office*